United States Patent
Choi et al.

(10) Patent No.: US 9,759,958 B2
(45) Date of Patent: Sep. 12, 2017

(54) ARRAY SUBSTRATE, DISPLAY DEVICE AND METHOD FOR MANUFACTURING ARRAY SUBSTRATE

(71) Applicant: BOE TECHNOLOGY GROUP CO., LTD., Beijing (CN)

(72) Inventors: Hyunsic Choi, Beijing (CN); Hui Li, Beijing (CN); Zhiqiang Xu, Beijing (CN); Yoonsung Um, Beijing (CN)

(73) Assignee: BOE TECHNOLOGY GROUP CO., LTD. (CN)

( * ) Notice: Subject to any disclaimer, the term of this patent is extended or adjusted under 35 U.S.C. 154(b) by 337 days.

(21) Appl. No.: 14/382,017

(22) PCT Filed: Dec. 17, 2013

(86) PCT No.: PCT/CN2013/089680
§ 371 (c)(1),
(2) Date: Aug. 29, 2014

(87) PCT Pub. No.: WO2015/027632
PCT Pub. Date: Mar. 5, 2015

(65) Prior Publication Data
US 2016/0291417 A1    Oct. 6, 2016

(30) Foreign Application Priority Data

Aug. 30, 2013 (CN) .......................... 2013 1 0389337

(51) Int. Cl.
*G02F 1/1333* (2006.01)
*G02F 1/1343* (2006.01)
(Continued)

(52) U.S. Cl.
CPC ...... *G02F 1/134309* (2013.01); *G02F 1/1368* (2013.01); *G02F 1/13439* (2013.01);
(Continued)

(58) Field of Classification Search
CPC ...... G02F 1/13; G02F 1/136; G02F 1/134363; G02F 1/136286; G02F 1/1368;
(Continued)

(56) References Cited

U.S. PATENT DOCUMENTS

| | | | |
|---|---|---|---|
| 7,821,607 B2 * | 10/2010 | Ohta ................. | G02F 1/134363 349/141 |
| 2002/0089631 A1 * | 7/2002 | Lee ................... | G02F 1/134363 349/141 |

(Continued)

FOREIGN PATENT DOCUMENTS

| | | |
|---|---|---|
| CN | 102629055 | 8/2012 |
| CN | 102645808 | 8/2012 |

(Continued)

OTHER PUBLICATIONS

Office Action in Chinese Patent Application No. 201310389337.1, dated May 31, 2106.

(Continued)

*Primary Examiner* — Thoi Duong
(74) *Attorney, Agent, or Firm* — Brooks Kushman P.C.

(57) ABSTRACT

The array substrate comprises a pixel electrode located in a pixel area and a common electrode corresponding to the pixel area; and a first passivation layer provided between the common electrode and the pixel electrode; wherein the pixel electrode comprises a plurality of strip-shaped first pixel electrodes and strip-shaped second pixel electrodes which are alternately arranged at intervals; and the common electrode comprises a plurality of strip-shaped common electrodes which are spaced from each other; wherein ends of the plurality of strip-shaped first pixel electrodes are connected to each other to form a comb shape, and ends of the plurality of strip-shaped second pixel electrodes are connected to each other to form a comb shape; and the comb- (Continued)

shaped first pixel electrode and the comb-shaped second pixel electrode are spaced from each other.

13 Claims, 2 Drawing Sheets

(51) Int. Cl.
G02F 1/1335 (2006.01)
G02F 1/1362 (2006.01)
G02F 1/1368 (2006.01)
H01L 27/12 (2006.01)

(52) U.S. Cl.
CPC .. *G02F 1/133512* (2013.01); *G02F 1/134363* (2013.01); *G02F 1/136286* (2013.01); *H01L 27/124* (2013.01); *H01L 27/1259* (2013.01); G02F 2001/134318 (2013.01); G02F 2201/121 (2013.01); G02F 2201/123 (2013.01); G02F 2201/124 (2013.01)

(58) Field of Classification Search
CPC ......... G02F 1/133345; G02F 1/134309; G02F 1/133512; G02F 1/134336; G02F 1/136209; G02F 1/1362; G02F 1/136213; G02F 1/1343; G02F 1/1333; G02F 2001/134318; G02F 2001/133357; G02F 2201/40; G02F 2201/124; G02F 2201/122; H01L 23/5386; H01L 24/03; H01L 27/3244; H01L 27/3276; H01L 2924/13069; H01L 29/4908; H01L 29/78633; G06F 3/0412; G06F 3/044

USPC ....... 257/72, 59, E33.062; 349/139, 141, 43, 349/138, 33, 143, 187, 110; 438/158; 345/87, 92, 103, 58
See application file for complete search history.

(56) References Cited

U.S. PATENT DOCUMENTS

2002/0140649 A1   10/2002  Aoyama et al.
2005/0030461 A1*  2/2005  Ono ................ G02F 1/133345
                                                                              349/141
2006/0066798 A1    3/2006  Hwang et al.

FOREIGN PATENT DOCUMENTS

| CN | 102854671 | 1/2013 |
|---|---|---|
| CN | 103176317 | 6/2013 |
| CN | 203149252 | 8/2013 |
| CN | 103439840 | 12/2013 |
| CN | 203405655 | 1/2014 |

OTHER PUBLICATIONS

Office Action in Chinese Patent Application No. 201310389337.1, dated Nov. 30, 2015.
Office Action issued in corresponding Chinese Application No. 2013103893371 dated Jun. 2, 2015.
International Search Report and Written Opinion issued in corresponding International Application No. PCT/CN2013/089680 dated Jun. 3, 2014.

* cited by examiner

ND METHOD FOR MANUFACTURING ARRAY SUBSTRATE

ARRAY SUBSTRATE, DISPLAY DEVICE AND METHOD FOR MANUFACTURING ARRAY SUBSTRATE

CROSS-REFERENCE TO RELATED APPLICATION

This application is the U.S. national phase of PCT Application No. PCT/CN2013/089680 filed on Dec. 17, 2013, which claims priority to Chinese Patent Application No. 201310389337.1 filed on Aug. 30, 2013, the disclosures of which are incorporated in their entirety by reference herein.

TECHNICAL FIELD

The present invention relates to the field of liquid crystal display technique, and more particularly to an array substrate, a display device and a method for manufacturing the array substrate.

BACKGROUND

Currently, with the development of liquid crystal display technique, liquid crystal display device will increasingly focus on the growing demands for high transmittance, wide angle of view and other characteristics.

Advanced super dimension switch (ADSDS, which is briefly referred to as ADS) technique has core technical characteristics described as follows: a multi-dimensional electric field can be formed with both an electric field produced at edges of slit electrodes on the same plane and an electric field produced between a slit electrode layer and a plate-shaped electrode layer, so that all orientational liquid crystal molecules, which are located directly above the slit electrodes and between the slit electrodes in a liquid crystal cell, can be rotated, which enhances the work efficiency of liquid crystals and increases light transmittance. The ADS technique can improve the picture quality of a thin film transistor liquid crystal display (TFT-LCD) product, and has advantages of high resolution, high transmittance, low power consumption, wide angle of view, high aperture ratio, low chromatic aberration and no push Mura.

As shown in FIG. 1, a conventional liquid crystal display device in an ADS mode includes a common electrode 1 and a pixel electrode 2 corresponding to the common electrode, and an insulating layer 3 is provided between the common electrode 1 and the pixel electrode 2. The common electrode 1 is a plate-shaped electrode, and the pixel electrode 2 includes a plurality of strip-shaped positive electrodes and strip-shaped negative electrodes which are alternately arranged at intervals. In operation, there is a voltage difference between adjacent pixel electrodes, and also there is a voltage difference between the common electrode 2 and the pixel electrode 1.

In the conventional liquid crystal device in the ADS mode, since the common electrode 1 corresponds to the pixel electrode 2 and the common electrode 1 is a plate-shaped electrode, value of a storage capacitance Cst between the common electrode 1 and the pixel electrode 2 is large. When the Cst is relatively large, it will put a burden on pixel charging.

SUMMARY

The technical problem to be solved by an embodiment of the present invention is to provide an array substrate, a method for manufacturing the array substrate and a display device, which can reduce the burden of pixel charging and contribute to save electric energy.

In order to solve the above-described technical problem, an array substrate is provided according to an embodiment of the present invention which adopts the following technical solution.

The array substrate includes a pixel electrode located in a pixel area and a common electrode corresponding to the pixel area; and a first passivation layer provided between the common electrode and the pixel electrode; wherein the pixel electrode includes a plurality of strip-shaped first pixel electrodes and strip-shaped second pixel electrodes which are alternately arranged at intervals; and the common electrode includes a plurality of strip-shaped common electrodes which are spaced from each other; wherein ends of the plurality of strip-shaped first pixel electrodes are connected to each other to form a comb shape, and ends of the plurality of strip-shaped second pixel electrodes are connected to each other to form a comb shape; and the comb-shaped first pixel electrode and the comb-shaped second pixel electrode are spaced from each other.

Alternatively, the strip-shaped common electrode is arranged in the same direction as the strip-shaped first pixel electrode and the strip-shaped second pixel electrode; and each strip-shaped common electrode corresponds to a gap between the strip-shaped first pixel electrode and the strip-shaped second pixel electrode adjacent thereto, each strip-shaped first pixel electrode or strip-shaped second pixel electrode corresponds to a gap between two strip-shaped common electrodes adjacent thereto.

Alternatively, the array substrate further includes a data line, wherein the common electrode is located above the data line, and one of the plurality of strip-shaped common electrodes is provided above the data line; and a second passivation layer provided between the strip-shaped common electrode and the data line.

Alternatively, the second passivation layer is made of a resin material.

Alternatively, the strip-shaped common electrode provided above the data line has a width larger than that of the data line.

Alternatively, the strip-shaped common electrode above the data line has a width larger than those of other strip-shaped common electrodes.

Alternatively, the pixel electrode is provided above or below the common electrode.

According to an embodiment of the present invention, there is provided a method for manufacturing an array substrate, the method including:

forming a first passivation layer on a substrate formed with a thin film transistor;

forming a common electrode layer on the substrate formed with the first passivation layer; and fabricating the common electrode layer into a plurality of strip-shaped common electrodes which are spaced from each other.

Alternatively, after forming the common electrode layer on the substrate formed with the first passivation layer, the above-described method further includes:

forming a second passivation layer on the substrate formed with the strip-shaped common electrodes; and forming patterns of a strip-shaped first pixel electrode and a strip-shaped second pixel electrode, which are alternately arranged at intervals, on the substrate formed with the second passivation layer; wherein ends of patterns of a plurality of strip-shaped first pixel electrodes are connected to each other to form a comb shape, and ends of patterns of a plurality of strip-shaped second pixel electrodes are connected to each other to form a comb shape; and the pattern of the comb-shaped first pixel electrode and the pattern of the comb-shaped second pixel electrode are spaced from each other.

Alternatively, the strip-shaped common electrode is arranged in the same direction as the strip-shaped first pixel electrode and the strip-shaped second pixel electrode; and each strip-shaped common electrode corresponds to a gap between the strip-shaped first pixel electrode and the strip-shaped second pixel electrode adjacent thereto, each strip-shaped first pixel electrode or strip-shaped second pixel electrode corresponds to a gap between two strip-shaped common electrodes adjacent thereto.

Alternatively, the step of fabricating the common electrode layer into a plurality of strip-shaped common electrodes which are spaced from each other includes:

fabricating the common electrode layer into a plurality of strip-shaped common electrodes which are spaced from each other, wherein one of the plurality of strip-shaped common electrodes is provided above the data line of the array substrate; and providing a first passivation layer between the strip-shaped common electrode and the data line.

According to an embodiment of the present invention, there is provided a method for manufacturing an array substrate, the method including:

forming a first passivation layer on a substrate formed with a thin film transistor;

forming patterns of a strip-shaped first pixel electrode and a strip-shaped second pixel electrode, which are alternately arranged at intervals, on the substrate formed with the first passivation layer; wherein ends of patterns of a plurality of strip-shaped first pixel electrodes are connected to each other to form a comb shape, and ends of patterns of a plurality of strip-shaped second pixel electrodes are connected to each other to form a comb shape; and the pattern of the comb-shaped first pixel electrode and the pattern of the comb-shaped second pixel electrode are spaced from each other;

forming a second passivation layer on the substrate formed with the strip-shaped first pixel electrode and the strip-shaped second pixel electrode which are alternately arranged at intervals;

forming a common electrode layer on the substrate formed with the second passivation layer; and fabricating the common electrode layer into a plurality of strip-shaped common electrodes which are spaced from each other.

Alternatively, the strip-shaped common electrode is arranged in the same direction as the strip-shaped first pixel electrode and the strip-shaped second pixel electrode; and each strip-shaped common electrode corresponds to a gap between the strip-shaped first pixel electrode and the strip-shaped second pixel electrode adjacent thereto, each strip-shaped first pixel electrode or strip-shaped second pixel electrode corresponds to a gap between two strip-shaped common electrodes adjacent thereto.

There is provided a display device including the above array substrate.

The above technical solution of the present invention has the following beneficial effects.

In the above-described solution, with respect to the case that a common electrode corresponding to a pixel area is a plate-shaped electrode in the prior art, the array substrate, the display device and the method for manufacturing the array substrate according to the embodiments of the present invention enables a storage capacitance Cst between the common electrode and the pixel electrode to be reduced since the common electrode corresponding to the pixel area includes a plurality of strip-shaped common electrodes which are spaced from each other, thereby reducing the burden of pixel charging and contributing to save electric energy.

DETAILED DESCRIPTION

To make technical problems to be solved, and technical solutions and advantages of the present invention more apparent, the present invention will be described in detail hereinafter in conjunction with the drawings and the embodiments.

Figure 1:
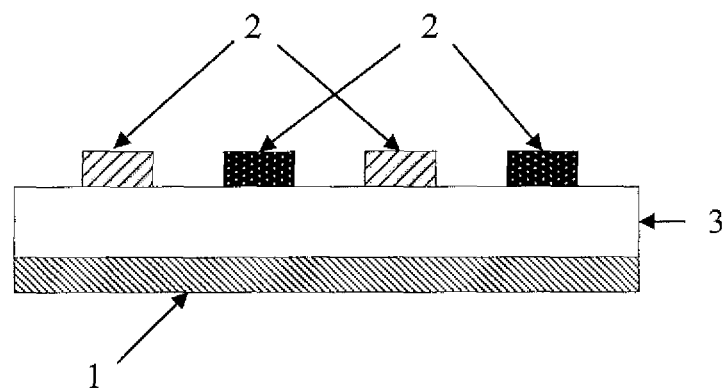
FIG. 1 is a schematic structural view of an arrangement of a common electrode and a pixel electrode in the prior art.
Figure 2:
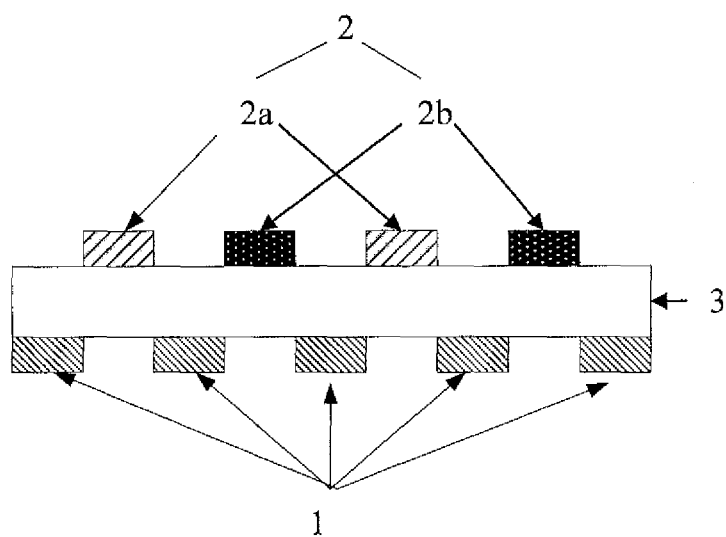
FIG. 2 is a schematic structural view of an arrangement of a common electrode and a pixel electrode on an array substrate according to an embodiment of the present invention.
Figure 3:
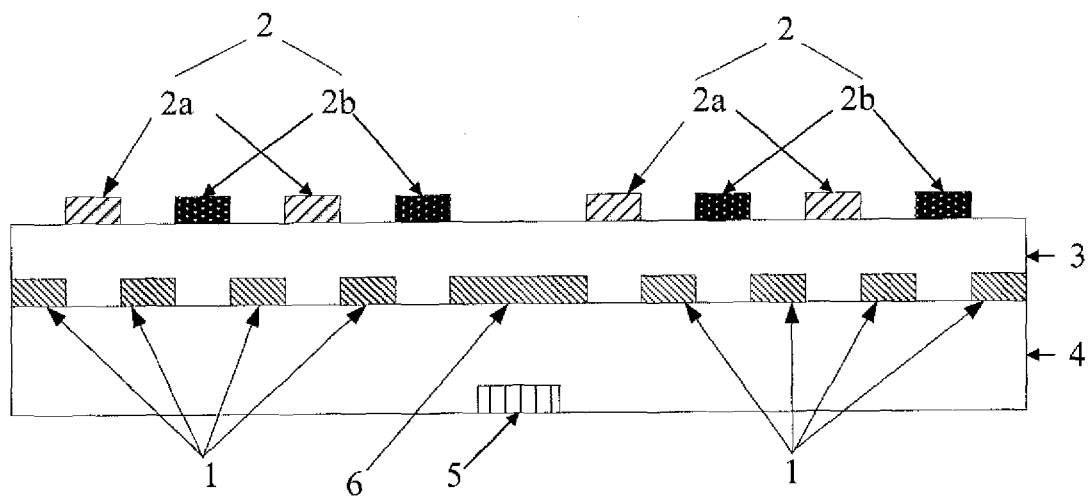
FIG. 3 is a schematic structural view of an arrangement of a common electrode and a pixel electrode on an array substrate according to another embodiment of the present invention.

As shown in FIGS. 2 and 3, an array substrate according to an embodiment of the present invention includes: a pixel electrode 2 located in a pixel area and a common electrode 1 corresponding to the pixel area; a first passivation layer 3 is provided between the common electrode 1 and the pixel electrode 2; wherein the pixel electrode 2 includes a plurality of strip-shaped first pixel electrodes 2a and a plurality of strip-shaped second pixel electrodes 2b which are alternately arranged at intervals; and the common electrode 1 includes a plurality of strip-shaped common electrodes which are spaced from each other; wherein ends of the plurality of strip-shaped first pixel electrodes 2a are connected to each other to form a comb shape, and ends of the plurality of strip-shaped second pixel electrodes 2b are connected to each other to form a comb shape; and the comb-shaped first pixel electrode and the comb-shaped second pixel electrode are spaced from each other.

Relative to the substrate, the common electrode may be fabricated under the pixel electrode, and also may be fabricated above the pixel electrode. FIG. 2 exemplarily shows the case that the common electrode is fabricated under the pixel electrode.

In the array substrate according to the embodiment of the present invention, the storage capacitance Cst between the common electrode and the pixel electrode can be reduced since the common electrode corresponding to the pixel area includes a plurality of strip-shaped common electrodes which are spaced from each other, thereby reducing the burden of pixel charging and contributing to save electric energy.

In the above-described embodiment of the array substrate, in order to minimize the storage capacitance Cst between the common electrode and the pixel electrode, alternatively, the strip-shaped common electrode is arranged in the same direction as the strip-shaped first pixel electrode and the strip-shaped second pixel electrode; and each strip-shaped common electrode corresponds to a gap between the strip-shaped first pixel electrode and the strip-shaped second pixel electrode adjacent thereto (i.e., a slit area between the strip-shaped first pixel electrode and the strip-shaped second pixel electrode), each strip-shaped first pixel electrode or strip-shaped second pixel electrode corresponds to a gap between two strip-shaped common electrodes adjacent thereto. Thus, the common electrode overlapping with the pixel electrode in the projection direction is not formed in a lower or upper area of the pixel electrode. In this case, direct overlapping (i.e., capping) does not occur but stripe-like staggered overlapping (i.e., fringe capping) occurs between the pixel electrode and the common electrode, and the stripe-like staggered overlapping may cause the value of the storage capacitance Cst between the pixel electrode and the common electrode to become small as compared with the direct overlapping.

As shown in FIG. 3, in the above-described embodiment of the array substrate, the array substrate further includes a data line 5; in order to enable to prevent light leakage of electric field of the data line part and increase aperture ratio, alternatively, the common electrode is located above the data line 5, and one of a plurality of strip-shaped common electrodes, i.e., a strip-shaped common electrode 6 is provided above the data line, and a second passivation layer 4 is provided between strip-shaped common electrode 6 and the data line 5. Alternatively, the second passivation layer 4 is made of a resin material. In the structure of overlapping the common electrode 6 on the upper portion of the data line 5, the electric field of the data line part is shielded by the common electrode 6 and thereby the light leakage is reduced, whereby a narrower black matrix may be used so as to increase the aperture ratio and thereby the overall panel transmittance is increased. Further, due to the presence of the strip-shaped common electrode 6, the impact of the data line to the pixel electrode is shielded by the strip-shaped common electrode 6, so that the influence of the data line to the pixel electrode is reduced to a minimum. The presence of the resin layer contributes to reduce coupling capacitance Cdc between the data line and the common electrode, and thus the resin layer is alternatively a resin layer with a low capacitance, and further the resin layer may be fabricated to be thicker based on the actual situation.

In the above-described embodiment of the array substrate, the strip-shaped common electrode 6 provided above the data line 5 has a width larger than that of the data line 5, and a narrower black matrix may be used so as to increase the aperture ratio and thereby the overall panel transmittance is increased.

In the above-described embodiment of the array substrate, the strip-shaped common electrode above the data line alternatively has a width larger than those of other strip-shaped common electrodes.

According to an embodiment of the present invention, there is also provided a method for manufacturing an array substrate, the method including the following steps:

S10: forming a first passivation layer on a substrate formed with a thin film transistor;

S20: forming a common electrode layer on the substrate formed with the first passivation layer; and S30: fabricating the common electrode layer into a plurality of strip-shaped common electrodes which are spaced from each other.

In the embodiment of the method for manufacturing the array substrate according to the present invention, the storage capacitance Cst between the common electrode and the pixel electrode can be reduced since the common electrode layer is fabricated into a plurality of strip-shaped common electrodes which are spaced from each other, thereby reducing the burden of pixel charging and contributing to save electric energy.

In the above-described embodiment of the method for manufacturing the array substrate, the method for manufacturing the array substrate further includes steps after S30:

S40: forming a second passivation layer on the substrate formed with the strip-shaped common electrode; and S50: forming patterns of a strip-shaped first pixel electrode and a strip-shaped second pixel electrode, which are alternately arranged at intervals, on the substrate formed with the second passivation layer; wherein ends of patterns of a plurality of strip-shaped first pixel electrodes are connected to each other to form a comb shape, and ends of patterns of a plurality of strip-shaped second pixel electrodes are connected to each other to form a comb shape; and the pattern of the comb-shaped first pixel electrode and the pattern of the comb-shaped second pixel electrode are spaced from each other.

In the embodiment of the above-described method for manufacturing the array substrate, alternatively, the strip-shaped common electrode is arranged in the same direction as the strip-shaped first pixel electrode and the strip-shaped second pixel electrode; and each strip-shaped common electrode corresponds to a gap between the strip-shaped first pixel electrode and the strip-shaped second pixel electrode adjacent thereto, each strip-shaped first pixel electrode or strip-shaped second pixel electrode corresponds to a gap between two strip-shaped common electrodes adjacent thereto.

Thus, the common electrode overlapping with the pixel electrode in the projection direction is not formed in a lower area of the pixel electrode. In this case, direct overlapping (i.e., capping) does not occur but stripe-like staggered overlapping (i.e., fringe capping) occurs between the pixel electrode and the common electrode, and the stripe-like staggered overlapping may cause value of the storage capacitance Cst between the pixel electrode and the common electrode to become small as compared with the direct overlapping.

In the above-described embodiment of the method for manufacturing the array substrate, the step of fabricating the common electrode layer into a plurality of strip-shaped common electrodes which are spaced from each other in S30 includes:

fabricating the common electrode layer into a plurality of strip-shaped common electrodes which are spaced from each other, wherein one of the plurality of strip-shaped common electrodes is provided above the data line of the array substrate; and providing a first passivation layer between the strip-shaped common electrode and the data line.

Specifically, the first passivation layer is made of a resin material.

Further, the strip-shaped common electrode provided above the data line has a width larger than that of the data line.

Further, the strip-shaped common electrode above the data line has a width larger than those of other strip-shaped common electrodes.

In the above-described method for manufacturing the array substrate according to an embodiment, advantages of the case that one of the plurality of strip-shaped common electrodes is provided above the data line of array substrate and the strip-shaped common electrode provided above the data line has a width larger than that of the data line is the same as that of the above-described embodiments of the array substrate, which are not discussed here for simplicity.

Relative to the substrate, the common electrode may be fabricated under the pixel electrode, and also may be fabricated above the pixel electrode. Another embodiment of the present invention describes a method for manufacturing an array substrate on which a common electrode is fabricated above the pixel electrode, and the method includes:

forming a first passivation layer on a substrate formed with a thin film transistor;

forming patterns of a strip-shaped first pixel electrode and a strip-shaped second pixel electrode, which are alternately arranged at intervals, on the substrate formed with the first passivation layer; wherein ends of patterns of a plurality of strip-shaped first pixel electrodes are connected to each other to form a comb shape, and ends of patterns of a plurality of strip-shaped second pixel electrodes are connected to each other to form a comb shape; and the pattern of the comb-shaped first pixel electrode and the pattern of the comb-shaped second pixel electrode are spaced from each other;

forming a second passivation layer on the substrate formed with the strip-shaped first pixel electrode and the strip-shaped second pixel electrode which are alternately arranged at intervals;

forming a common electrode layer on the substrate formed with the second passivation layer; and fabricating the common electrode layer into a plurality of strip-shaped common electrodes which are spaced from each other.

Alternatively, the strip-shaped common electrode is arranged in the same direction as the strip-shaped first pixel electrode and the strip-shaped second pixel electrode; and each strip-shaped common electrode corresponds to a gap between the strip-shaped first pixel electrode and the strip-shaped second pixel electrode adjacent thereto, each strip-shaped first pixel electrode or strip-shaped second pixel electrode corresponds to a gap between two strip-shaped common electrodes adjacent thereto.

It should be note that, the first passivation layer and the second passivation layer are not used to define the order and number of the passivation layers, but only are used to distinguish different passivation layers in different embodiments. Next, the method for manufacturing the array substrate according to one embodiment of the present invention is described in detail, and the method may include steps S1 to S6.

In the step S1, a gate electrode and a gate line are formed on a substrate.

First, a gate metal layer may be formed on the substrate by using sputtering, thermal evaporation or other film forming method, and the gate metal layer may be made of Cr, Mo, Al, Cu, W, Nd and alloys thereof, and the gate metal layer may include one or more layers; then, photoresist is coated on the gate metal layer; Next, the photoresist is exposed and developed by utilizing a mask plate having patterns, thereby forming a photoresist-totally-remained area and a photoresist-totally-removed area, where the photoresist-totally-remained area corresponds to an area of a gate electrode and a gate line, and the photoresist-totally-removed area corresponds to an area other than the photoresist-totally-remained area; then, the gate metal layer in the photoresist-totally-removed area is removed by an etching process; finally, the photoresist in the photoresist-totally-remained area is peeled off, thereby forming patterns of the gate electrode and the gate line.

In the step S2, a gate insulating layer is formed on the substrate formed with the gate electrode and the gate line.

The gate insulating layer may be deposited on the substrate formed after the step S1 by utilizing a method such as plasma enhanced chemical vapor deposition (PECVD), and the gate insulating layer may be made of an oxide (e.g. $SiO_x$) or a nitride (e.g., $SiN_x$) and other materials.

In the step S3, a semiconductor layer, a source electrode, a drain electrode and the data line are formed on the gate insulating layer.

Specifically, the step S3 may be completed by using a one-time patterning process, and also may be completed by using a two-time patterning process.

The one-time patterning process may include the following steps:

forming a semiconductor film and a source-drain metal film on the gate insulating layer; coating a photoresist on the source-drain metal film; exposing and developing the photoresist by utilizing a grey tone or half tone mask plate, thereby forming a photoresist-totally-remained area, a photoresist-half-remained area and a photoresist-totally-removed area, where the photoresist-totally-remained area corresponds to an area of the source electrode and the drain electrode, the photoresist-half-remained area corresponds to a TFT channel area, and the photoresist-totally-removed area corresponds to an area other than the photoresist-totally-remained area and the photoresist-half-remained area; removing the source-drain metal film and the semiconductor film below the source-drain metal film in the photoresist-totally-removed area by the etching process, thereby forming a pattern of the semiconductor layer; removing the photoresist in the photoresist-half-remained area by utilizing an ashing process; and removing the source-drain metal film in the photoresist-half-remained area by utilizing the etching process, thereby forming patterns of the source electrode, the drain electrode, the data line and the TFT channel.

The two-time patterning process may include the following steps:

a first patterning process: forming a semiconductor film on the gate insulating layer; coating a photoresist on the semiconductor film; exposing and developing the photoresist by utilizing a mask plate having patterns, thereby forming a photoresist-totally-remained area and a photoresist-totally-removed area, where the photoresist-totally-remained area corresponds to a semiconductor layer pattern area, and the photoresist-totally-removed area corresponds to an area other than the photoresist-totally-remained area; removing the semiconductor film in the photoresist-totally-removed area by the etching process; peeling off the photoresist in the photoresist-totally-remained area, thereby forming a pattern of the semiconductor layer; and a second patterning process: forming a source-drain metal film on the substrate formed with the pattern of the semiconductor layer; coating a photoresist on the metal film; exposing and developing the photoresist by utilizing a mask plate having patterns, thereby forming a photoresist-totally-remained area and a photoresist-totally-removed area, where the photoresist-totally-remained area corresponds to an area of a source electrode, a drain electrode and a data line, and the photoresist-totally-removed area corresponds to an area other than the photoresist-totally-remained area; removing the source-drain metal film in the photoresist-totally-removed area by utilizing the etching process; peeling off the photoresist in the photoresist-totally-remained area, thereby forming patterns of the source electrode, the drain electrode and the data line.

Specifically, the semiconductor film may be an ordinary silicon semiconductor (intrinsic semiconductor+doped semiconductor), or may be an organic semiconductor, or may be an oxide semiconductor.

In order to improve characteristics of the thin film transistor, the step S3 may further include: providing an ohmic contact layer among the source electrode, the drain electrode and the semiconductor layer so as to improve contact resistance of the source electrode, the drain electrode and the semiconductor layer.

In step S4, a resin layer and a common electrode are formed on the substrate formed with the semiconductor layer, the source electrode, the drain electrode and the data line; where the common electrode includes a plurality of strip-shaped common electrodes which are spaced from each other and located in a display area, and strip-shaped common electrodes located above the data line.

First, a resin layer is formed on the substrate formed with the semiconductor layer, the source electrode, the drain electrode and the data line;

Second, a transparent conductive layer may be formed on the substrate formed with the semiconductor layer, the source electrode, the drain electrode and the data line by using magnetron sputtering, thermal evaporation or other film forming method, and the transparent conductive layer may be made of indium tin oxide (ITO), indium zinc oxide (IZO), or aluminum zinc oxide and other materials.

Next, a photoresist is coated on the transparent conductive layer; the photoresist is exposed and developed by utilizing a mask plate having patterns, thereby forming a photoresist-totally-remained area and a photoresist-totally-removed area, where the photoresist-totally-remained area corresponds to a common electrode area, and the photoresist-totally-removed area corresponds to an area other than the photoresist-totally-remained area;

Then, the transparent conductive layer in the photoresist-totally-removed area is removed by utilizing the etching process, thereby forming a pattern of the common electrode; finally, the photoresist in the photoresist-totally-remained area is peeled off.

In step S5, a passivation layer is formed on substrate formed with the resin layer and the common electrode.

The passivation layer may be deposited on the substrate formed after step S4 by utilizing a method such as PECVD, and the passivation layer may be made of SiNx, SiOx or other material.

In step S6, a pixel electrode is formed on the passivation layer, the pixel electrode is electrically connected to the drain electrode via a via hole in the passivation layer and a via hole in the resin layer; where the pixel electrode includes a plurality of strip-shaped positive pixel electrodes and strip-shaped negative pixel electrodes which are alternately arranged at intervals;

First, a transparent conductive layer may be formed on the substrate formed with the passivation layer by using magnetron sputtering, thermal evaporation or other film forming method, and the transparent conductive layer may be made of indium tin oxide (ITO), indium zinc oxide (IZO), or aluminum zinc oxide and other materials;

Then, a photoresist is coated on the transparent conductive layer; the photoresist is exposed and developed by utilizing a mask plate having patterns, thereby forming a photoresist-totally-remained area and a photoresist-totally-removed area, where the photoresist-totally-remained area corresponds to a pixel electrode area, and the photoresist-totally-removed area corresponds to an area other than the photoresist-totally-remained area; then, the transparent conductive layer in the photoresist-totally-removed area is removed by utilizing the etching process, and the photoresist in the photoresist-totally-remained area is peeled off, thereby forming a pattern of the pixel electrode.

According to an embodiment of the present invention, there is also provided a display device including any one of the array substrates according to the above embodiments. The display device may use any one of the array substrates as described in the above embodiments. The display device may be any product or component having a display function, such as a liquid crystal panel, an electronic paper, an OLED panel, a mobile phone, a tablet computer, a television, a display, a laptop, a digital photo frame and a navigator.

The above are merely the preferred embodiments of the present invention. It should be noted that those skilled in the art may further make various improvements and modifications without departing from the principle of the present invention, and these improvements and modifications should be considered to be within the scope of the present invention.

What is claimed is:

1. An array substrate, comprising a pixel electrode located in a pixel area and a common electrode corresponding to the pixel area; and a first passivation layer provided between the common electrode and the pixel electrode; wherein the pixel electrode comprises a plurality of strip-shaped first pixel electrodes and a plurality of strip-shaped second pixel electrodes which are alternately arranged at intervals; and the common electrode comprises a plurality of strip-shaped common electrodes which are spaced from each other; wherein ends of the plurality of strip-shaped first pixel electrodes are connected to each other to form a comb-shaped first pixel electrode, and ends of the plurality of strip-shaped second pixel electrodes are connected to each other to form a comb-shaped second pixel electrode; and the comb-shaped first pixel electrode and the comb-shaped second pixel electrode are spaced from each other, a projection of the pixel electrode onto the array substrate and a projection of the common electrode onto the array substrate do not overlap.

2. The array substrate according to claim 1, wherein the strip-shaped common electrode is arranged in the same direction as the strip-shaped first pixel electrode and the strip-shaped second pixel electrode; and
each strip-shaped common electrode corresponds to a gap between the strip-shaped first pixel electrode and the strip-shaped second pixel electrode adjacent thereto, each strip-shaped first pixel electrode or strip-shaped second pixel electrode corresponds to a gap between two strip-shaped common electrodes adjacent thereto.

3. The array substrate according to claim 1, wherein the array substrate further comprises a data line;
the common electrode is located above the data line, and one of the plurality of strip-shaped common electrodes is provided above the data line; and
a second passivation layer is provided between the strip-shaped common electrode and the data line.

4. The array substrate according to claim 2, wherein the array substrate further comprises a data line;
the common electrode is located above the data line, and one of the plurality of strip-shaped common electrodes is provided above the data line; and
a second passivation layer is provided between the strip-shaped common electrode and the data line.

5. The array substrate according to claim 3, wherein the second passivation layer is made of a resin material.

6. The array substrate according to claim 3, wherein the strip-shaped common electrode provided above the data line has a width larger than that of the data line.

7. The array substrate according to claim 3, wherein the strip-shaped common electrode above the data line has a width larger than those of other strip-shaped common electrodes.

8. The array substrate according to claim 1, wherein the pixel electrode is provided above or below the common electrode.

9. A method for manufacturing an array substrate, comprising:
- forming a first passivation layer on a substrate formed with a thin film transistor;
- forming a common electrode layer on the substrate formed with the first passivation layer; and
- fabricating the common electrode layer into a plurality of strip-shaped common electrodes which are spaced from each other,
- forming a second passivation layer on the substrate formed with the strip-shaped common electrodes; and
- forming patterns of a plurality of strip-shaped first pixel electrodes and a plurality of strip-shaped second pixel electrodes, which are alternately arranged at intervals, on the substrate formed with the second passivation layer;
- wherein ends of patterns of the plurality of strip-shaped first pixel electrodes are connected to each other to form a pattern of a comb shaped first pixel electrode, and ends of patterns of the plurality of strip-shaped second pixel electrodes are connected to each other to form a pattern of a comb-shaped second pixel electrode; and the pattern of the comb-shaped first pixel electrode and the pattern of the comb-shaped second pixel electrode are spaced from each other,
- wherein a projection of the plurality of strip-shaped first pixel electrodes and the plurality of strip-shaped second pixel electrodes onto the array substrate and a projection of the plurality of strip-shaped common electrodes onto the array substrate do not overlap.

10. The method according to claim 9, wherein
the strip-shaped common electrode is arranged in the same direction as the strip-shaped first pixel electrode and the strip-shaped second pixel electrode; and
each strip-shaped common electrode corresponds to a gap between the strip-shaped first pixel electrode and the strip-shaped second pixel electrode adjacent thereto, each strip-shaped first pixel electrode or strip-shaped second pixel electrode corresponds to a gap between two strip-shaped common electrodes adjacent thereto.

11. The method according to claim 9, wherein the step of fabricating the common electrode layer into a plurality of strip-shaped common electrodes which are spaced from each other comprises:
fabricating the common electrode layer into a plurality of strip-shaped common electrodes which are spaced from each other, wherein one of the plurality of strip-shaped common electrodes is provided above a data line of the array substrate; and
providing a first passivation layer between the strip-shaped common electrode and the data line.

12. A method for manufacturing an array substrate, comprising:
- forming a first passivation layer on a substrate formed with a thin film transistor;
- forming patterns of a strip-shaped first pixel electrode and a strip-shaped second pixel electrode, which are alternately arranged at intervals, on the substrate formed with the first passivation layer; wherein ends of patterns of a plurality of strip-shaped first pixel electrodes are connected to each other to form a pattern of a comb-shaped first pixel electrode, and ends of patterns of a plurality of strip-shaped second pixel electrodes are connected to each other to form a pattern of a comb-shaped second pixel electrode; and the pattern of the comb-shaped first pixel electrode and the pattern of the comb-shaped second pixel electrode are spaced from each other;
- forming a second passivation layer on the substrate formed with the strip-shaped first pixel electrode and the strip-shaped second pixel electrode which are alternately arranged at intervals;
- forming a common electrode layer on the substrate formed with the second passivation layer; and
- fabricating the common electrode layer into a plurality of strip-shaped common electrodes which are spaced from each other,
- wherein a projection of the plurality of strip-shaped first pixel electrodes onto the array substrate, a projection of the plurality of strip-shaped second pixel electrodes onto the array substrate and a projection of the plurality of strip-shaped common electrodes onto the array substrate do not overlap.

13. The method according to claim 12, wherein
the strip-shaped common electrode is arranged in the same direction as the strip-shaped first pixel electrode and the strip-shaped second pixel electrode; and
each strip-shaped common electrode corresponds to a gap between the strip-shaped first pixel electrode and the strip-shaped second pixel electrode adjacent thereto, each strip-shaped first pixel electrode or strip-shaped second pixel electrode corresponds to a gap between two strip-shaped common electrodes adjacent thereto.

* * * * *